(12) United States Patent
Phillips et al.

(10) Patent No.: US 7,704,097 B1
(45) Date of Patent: Apr. 27, 2010

(54) CONNECTOR ASSEMBLY HAVING AN ELECTROMAGNETIC SEAL ELEMENT

(75) Inventors: Michael J. Phillips, Camp Hill, PA (US); David Stanley Szczesny, Hershey, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/371,999

(22) Filed: Feb. 17, 2009

(51) Int. Cl.
*H01R 13/648* (2006.01)
(52) U.S. Cl. .............................. 439/607.01; 439/607.21
(58) Field of Classification Search ............ 439/607.01, 439/607.17, 607.18, 607.21
See application file for complete search history.

(56) References Cited

U.S. PATENT DOCUMENTS

| | | | |
|---|---|---|---|
| 4,512,623 A * | 4/1985 | Tomsa | 439/607.17 |
| 4,812,137 A * | 3/1989 | Wilson et al. | 439/607.17 |
| 5,445,542 A * | 8/1995 | Serizay | 439/607.17 |
| 6,478,622 B1 | 11/2002 | Hwang | |
| 6,558,191 B2 | 5/2003 | Bright et al. | |
| 6,943,287 B2 | 9/2005 | Lloyd et al. | |
| 7,001,217 B2 | 2/2006 | Bright et al. | |
| 7,070,446 B2 | 7/2006 | Henry et al. | |
| 7,249,966 B2 | 7/2007 | Long | |
| 7,357,673 B2 | 4/2008 | Long | |
| 2008/0057786 A1 | 3/2008 | Gu et al. | |
| 2008/0188126 A1* | 8/2008 | Magnusson | 439/607 |
| 2008/0299826 A1 | 12/2008 | Cheng et al. | |

* cited by examiner

*Primary Examiner*—Hien Vu

(57) ABSTRACT

A connector assembly includes a shielding cage, a center plate and an electromagnetic seal element. The shielding cage includes side walls with ports disposed between the side walls. The ports receive mating connectors through a mating interface of the shielding cage. The center plate includes transverse walls disposed between and coupling the side walls of the shielding cage to one another. The center plate separating the ports and defines a chamber between the transverse walls and the side walls of the shielding cage. The electromagnetic seal element is disposed in the chamber of the center plate and engages the transverse walls of the center plate to prevent electromagnetic interference within the center plate from radiating through the mating interface.

18 Claims, 5 Drawing Sheets

CONNECTOR ASSEMBLY HAVING AN ELECTROMAGNETIC SEAL ELEMENT

BACKGROUND OF THE INVENTION

The subject matter herein generally relates to electrical connector assemblies and, more particularly, to electromagnetic seals for connector assemblies.

Some known connector assemblies are shaped to receive one or more mating connectors. These connector assemblies include ports through which the mating connectors are loaded. For example, some known connector assemblies include shielding connector cages that include several ports. The connector cages include side walls that define the ports. The side walls are electrically grounded to shield other components near the connector cage from electromagnetic interference. The connector cages have a mating interface through which the mating connectors are loaded into the ports. The ports are separated from one another by a center plate. The mating connectors are loaded into the ports to mate with electrical connectors located in the connector assemblies.

Some of the known center plates have an interior chamber that may contain electromagnetic interference in the center plate. Gaps in the center plates may permit the electromagnetic interference to radiate from the connector cage. For example, some known center plates are fabricated from multiple components and include gaps between the components. The electromagnetic interference within the interior chambers of the center plates may radiate out of the gaps in the center plates and interfere with the mating connectors and other electronic components located near the connector assembly.

Some known center plates include latches that engage and secure mating connectors when the connectors are loaded into the connector cage. The latches are depressed or biased toward the center plates when the mating connectors engage the latches. The center plates may include openings through which the latches are biased when the latches are depressed by the mating connector. These openings may permit electromagnetic interference to radiate from the center plate and the connector assembly.

Thus, a need exists to reduce the amount of electromagnetic interference that radiates from connector cages.

BRIEF DESCRIPTION OF THE INVENTION

In one embodiment, a connector assembly includes a shielding cage, a center plate and an electromagnetic seal element. The shielding cage includes side walls with ports disposed between the side walls. The ports receive mating connectors through a mating interface of the shielding cage. The center plate includes transverse walls disposed between and coupling the side walls of the shielding cage to one another. The center plate separating the ports and defines a chamber between the transverse walls and the side walls of the shielding cage. The electromagnetic seal element is disposed in the chamber of the center plate and engages the transverse walls of the center plate to prevent electromagnetic interference within the center plate from radiating through the mating interface. Optionally, the electromagnetic seal element is an elastomeric conductive element. The center plate may include an aperture that permits permit light emitted by a light pipe disposed in the chamber to emanate from the center plate. The electromagnetic seal element may include an opening aligned with the aperture to permit at least one of the light and the light pipe to pass through the electromagnetic seal element.

In another embodiment, a center plate that is configured to retain mating connectors loaded into ports in a shielding cage through a mating interface is provided. The shielding cage includes side walls of the ports. The center plate includes transverse walls, a mating interface wall and an electromagnetic seal element. The transverse walls are disposed between and couple the side walls of the shielding cage to one another. The transverse walls separate the ports from one another and define a chamber between the transverse walls and the side walls of the shielding cage. The mating interface wall interconnects the transverse walls and is disposed proximate to the mating interface of the shielding cage. The electromagnetic seal element is disposed in the chamber and engages the transverse walls and the mating interface wall to prevent electromagnetic interference from radiating through the mating interface. Optionally, the electromagnetic seal element is compressed between the transverse walls when the mating connector is loaded into at least one of the ports. The transverse walls may include an opening through which the latch is depressed, the electromagnetic seal element electrically interconnecting the transverse walls to prevent the electromagnetic interference from radiating through the opening.

DETAILED DESCRIPTION OF THE INVENTION

Figure 1:
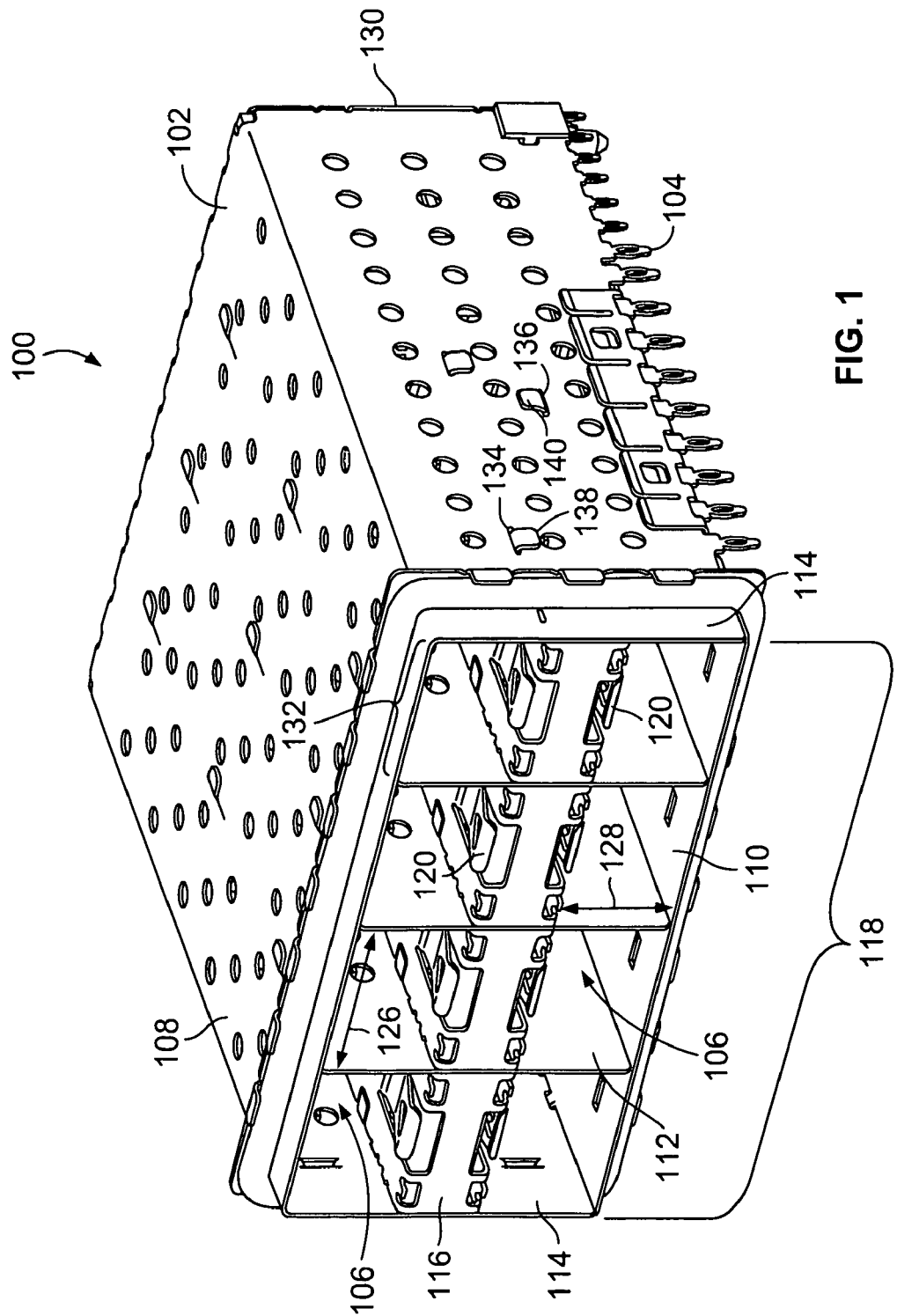
FIG. 1 is a front perspective view of a connector assembly according to one embodiment.

FIG. 1 is a front perspective view of a connector assembly 100 according to one embodiment. While the connector assembly 100 is described herein with particular reference to a vertically stacked receptacle connector assembly, it is to be understood that the embodiments described herein also may be applicable to other connectors. The following description is therefore provided for purposes of illustration, rather than limitation, and is but one potential application of the subject matter herein. The connector assembly 100 shown in FIG. 1 is a horizontally stacked receptacle assembly. The connector assembly 100 includes a shielding connector cage 102 that is shaped to receive a plurality of mating connectors 300 (shown in FIG. 3). The connector cage 102 is a shielding connector cage in one embodiment. For example, the connector cage 102 includes, or is formed from, a conductive material such as a metal. The connector cage 102 and/or one or more components of the connector cage 102 may be stamped and formed from a sheet of metal. In another example, the connector cage 102 includes, or is formed from, a non-conductive material, such as a polymer, that is at least partially plated with a conductive material. The connector cage 102 includes a plurality of grounding pins 104 that mechanically and electrically couple the connector cage 102 with at least one of a substrate and another connector assembly (not shown). For example, the grounding pins 104 may be press-fit into corresponding cavities (not shown) in a circuit board (not shown) to retain the connector cage 102 with respect to the circuit board and to electrically connect the connector cage 102 with an electrical ground of the circuit board.

The connector cage 102 includes a top wall 108, a bottom wall 110 on an opposite site of the connector cage 102, interior side walls 112, exterior side walls 114 and a rear wall 130. The top and bottom walls 108, 110 are approximately parallel to one another. The side walls 112, 114 are approximately parallel to one another and approximately perpendicular to the top and bottom walls 108, 110. The rear wall 130 is approximately perpendicular to the top, bottom and side walls 108, 110, 112, 114. Each of the top, bottom, side and rear walls 108, 110, 112, 114, 130 includes, or is formed from, a conductive material, such as a metal, in one embodiment. For example, the top, bottom, side and rear walls 108, 110, 112, 114, 130 may be stamped and formed from a sheet of metal. Alternatively, each of the top, bottom, side and rear walls 108, 110, 112, 114, 130 may include or be formed from a non-conductive material, such as a polymer, that is at least partially plated with a conductive material. A plurality of the top, bottom, side and rear walls 108, 110, 112, 114, 130 may be integrally formed as a unitary body. For example, the top, exterior side and rear walls 108, 114, 130 may be stamped and formed from a common sheet of metal.

The connector cage 102 includes one or more center plates 116. Each of the center plates 116 extends between one of the exterior side walls 114 and one of the interior side walls 112 or between a pair of the interior side walls 112 in the illustrated embodiment. For example, the center plates 116 may be mounted in the connector cage 102 such that the center plates 116 extend from one interior side wall 112 to a neighboring interior side wall 112 or from an interior side wall 112 to a neighboring exterior side wall 114. The center plates 116 mechanically and electrically couple neighboring side walls 112, 114 with one another and with the center plates 116.

The connector cage 102 defines a plurality of ports 106. Each of the ports 106 is bounded by a portion of the top, bottom and rear walls 108, 110. 130, a portion of each of a pair of opposing side walls 112, 114 and one of the center plates 116. The ports 106 have an interior width 126 that extends between the side walls 112, 114 that define the ports 106. The ports 106 have an interior height 128 that extends between the center plate 116 and one of the top and bottom walls 108, 110. The vertical spacing of the ports 106 with respect to one another may be adjusted by changing the vertical height of the center plate 116 in the connector cage 102. The side walls 112, 114 include a plurality of upper and lower slots 134, 136 that are positioned in the side walls 112, 114 to establish the vertical position of the center plates 116. For example, the slots 134, 136 are positioned and shaped to receive one or more tabs 138, 140 that laterally protrude from opposing sides of the center plates 116. The loading of the tabs 138, 140 into the slots 134, 136 vertically supports and positions the center plates 116 in the connector cage 102.

The ports 106 extend between the rear wall 130 and a mating interface 118 of the connector cage 102. The mating interface 118 represents a plane disposed at the front of the connector cage 102 that is framed by the top, bottom, and exterior side walls 108, 110, 114. The mating interface 118 is approximately parallel to the rear wall 130 and is approximately perpendicular to the top, bottom, and side walls 108, 110, 112, 114. The ports 106 are shown in FIG. 1 as being arranged in sets 132 of pairs of ports 106. For example, the ports 106 are arranged in FIG. 1 as vertically stacked sets 132 of two ports 106 separated by the center plate 116, with a plurality of sets 132 of the ports 106 being adjacent to one another. In another embodiment, the ports 106 may be disposed in a different arrangement. For example, a different number of ports 106 may be provided in each set 132 of ports 106 and/or a different number of sets 132 of ports 106 may be provided in the connector cage 102. In another example, the ports 106 in each set 132 may be oriented horizontally rather than vertically, as shown in FIG. 1.

The connector cage 102 receives mating connectors 300 (shown in FIG. 3) in the ports 106. The mating connectors 300 are loaded into the ports 106 through the mating interface 118. The mating connectors 300 mate with one or more connectors 200 (shown in FIG. 2) housed within the connector cage 102. A latch 120 of the center plate 116 engages the mating connector 300 inserted into a corresponding port 106 to retain the mating connector 300 in the port 106. The latch 120 may include a spring member that engages the mating connector 300, for example.

Figure 2:
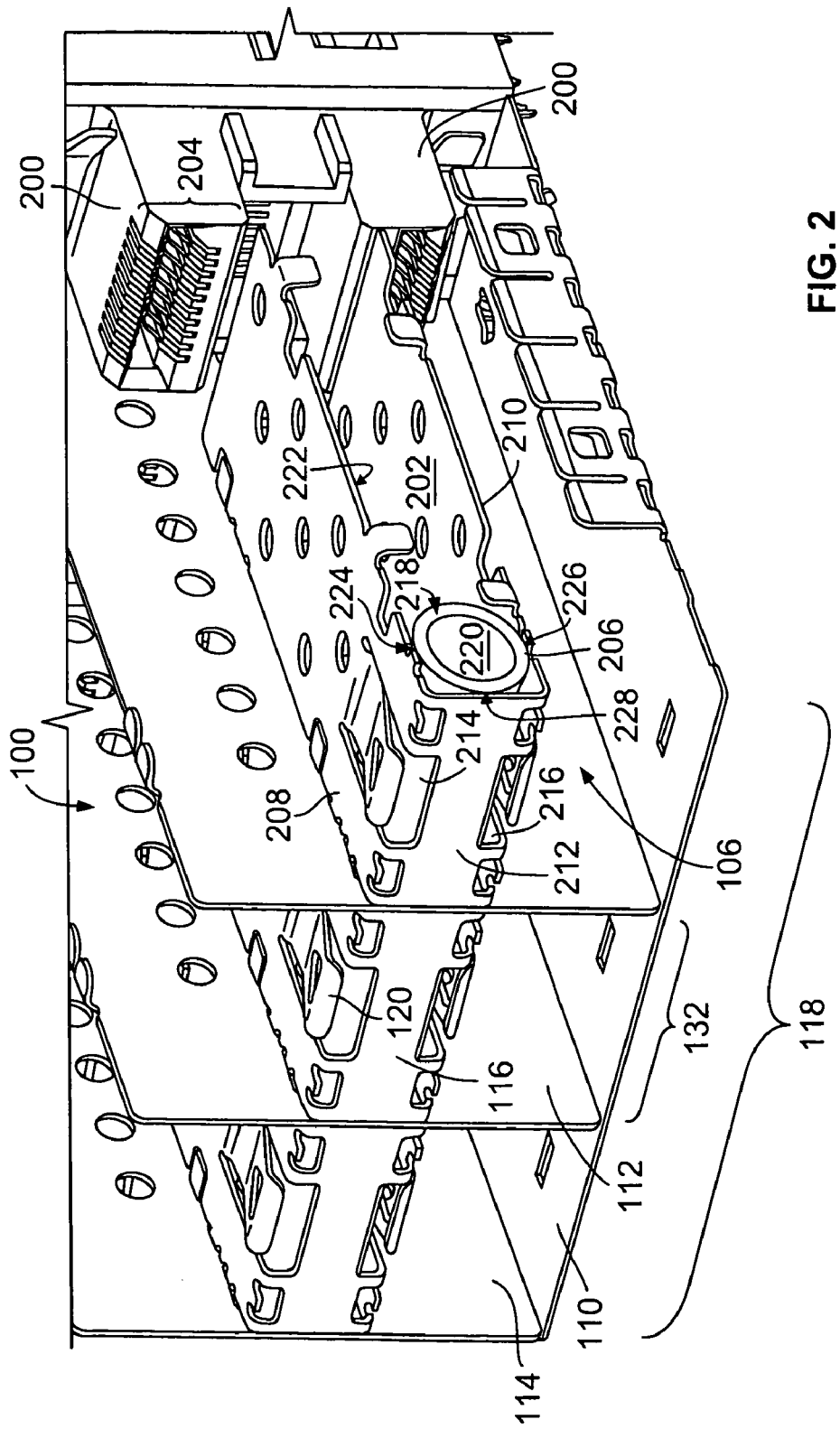
FIG. 2 is a cut-away view of the connector assembly shown in FIG. 1 implemented according to one embodiment.

FIG. 2 is a cut-away view of the connector assembly 100 implemented according to one embodiment. The top wall and one of the side exterior walls 114 are removed to illustrate the connectors 200 housed in the connector cage 102. The connectors 200 include mating faces 204 that mate with the mating connectors 300 (shown in FIG. 3) that are loaded into the ports 106. The center plate 116 includes a plurality of transverse walls 208, 210 interconnected by a mating interface wall 212. The transverse walls 208, 210 may be disposed approximately parallel to the top and bottom walls 108 (shown in FIG. 1), 110 and transverse to the side walls 112, 114. In the illustrated embodiment, the transverse walls 208, 210 are approximately parallel to the top and bottom walls 108, 110 and approximately perpendicular to the side walls 112, 114. The transverse walls 208, 210 define top and/or bottom sides of the ports 106 in the set 132 of ports 106. For example, the upper transverse wall 208 defines a bottom side of a top port 106 in the set 132 of ports 106 and the lower transverse wall 210 defines a top side of a bottom port 106 in the set 132 of ports 106. Each of the transverse walls 208, 210 includes the latch 120 to engage and retain a mating connector 300 (shown in FIG. 3). Openings 214, 216 in the transverse walls 208, 210 provide clearance for the latches 120 to be biased when the mating connectors 300 are loaded into the ports 106. For example, the latches 120 may be depressed through the openings 214, 216 when the mating connectors 300 engage the latches 120.

The mating interface wall 212 interconnects the transverse walls 208, 210. The mating interface wall 212 is located proximate to the mating interface 118 of the connector assembly 100. For example, the mating interface walls 212 may be coplanar with the plane defined by the mating interface 118. Alternatively, the mating interface walls 212 may be slightly recessed from or project past the mating interface 118. In the illustrated embodiment, the mating interface wall 212 extends from one interior side wall 112 to a neighboring interior side wall 112 or to a neighboring exterior side wall 114.

The center plate 116 is integrally formed as a unitary body in one embodiment. For example, the transverse walls 208, 210 and the mating interlace wall 212 may be stamped and formed from a common sheet of a conductive material, such as metal. Alternatively, the center plate 116 includes, or is formed from, a non-conductive material, such as a polymer, that is at least partially plated with a conductive material. The center plate 116 defines an interior chamber 202 between the transverse walls 208, 210 and the mating interface wall 212. The interior chamber 202 is bounded by the transverse walls 208, 210, the mating interface wall 212, neighboring side walls 112, 114, and the connectors 200.

An electromagnetic seal element 206 is disposed within the interior chamber 202 of the center plate 116. The seal element 206 includes an elastomeric conductive element that engages the transverse walls 208, 210 inside the interior chamber 202.

For example, the seal element 206 may contact the upper transverse wall 208 at an upper interface 224 and the lower transverse wall 210 at a lower interface 226. In one embodiment, the seal element 206 engages the mating interface wall 212 inside the interior chamber 202 at a forward interface 228. The upper, lower and forward interfaces 224, 226, 228 represent the surface-to-surface contact between the seal element 206 and each of the transverse walls 208, 210 and mating interface wall 212, respectively. For example, the surface areas of the seal element 206 and the upper transverse wall 208 that engage one another may represent the upper interface 224. The surface areas of the seal element 206 and the mating interface wall 212 that engage one another may represent the forward interface 228. The surface areas of the seal element 206 and the lower transverse wall 210 that engage one another may represent the lower interface 226. The seal element 206 may extend from one side wall 112, 114 to the neighboring side wall 112, 114 of the interior chamber 202. The seal element 206 shown in FIG. 2 has a tubular body 218 with a hollow center 220. Alternatively, the seal element 206 may have a solid cylindrical body with no hollow center 220. Other shapes and orientations of the seal element 206 also may be used.

The seal element 206 engages the center plate 116 along an inside surface 222 of the center plate 116 to reduce emission of electromagnetic interference from the connector assembly 100. The seal element 206 may form a seal in the interior chamber 202 that prevents electromagnetic interference from radiating from the center plate 116 through the mating interface 118. The seal element 206 may be positioned in the interior chamber 202 such that the openings 214, 216 are located between the seal element 206 and the mating interface wall 212. Alternatively, the seal element 206 may be located in the interior chamber 202 such that a portion of the seal element 206 engages the latch 120 when the latch 120 is biased toward the interior chamber 202. The seal element 206 may then provide an electrically conductive seal that contacts the transverse walls 208, 210 and the latches 120 when mating connectors 300 (shown in FIG. 3) are loaded into the ports 106.

Electromagnetic interference in the interior chamber 202 may escape from the center plate 116 through one or more of the openings 214, 216, for example. The seal element 206 reduces or prevents escape of the electromagnetic interference by electrically coupling the transverse walls 208, 210 such that the electromagnetic interference in the chamber 202 is directed to an electric ground reference rather than escape through the openings 214, 216. The electromagnetic interference may be communicated to an electric ground reference by a pathway that includes the seal element 206, the center plate 116 and the side walls 112, 114.

Figure 3:
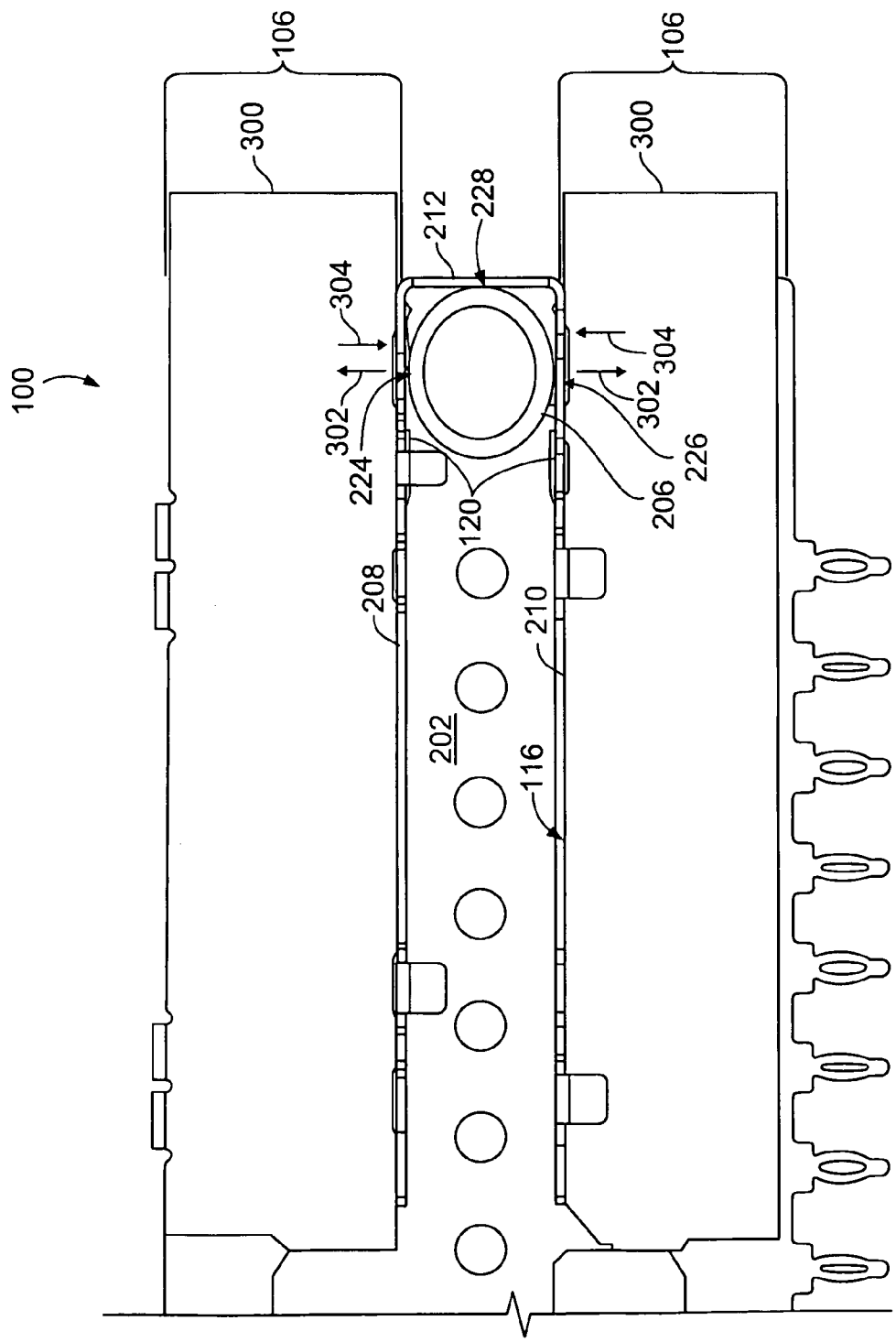
FIG. 3 is another cut away view of the connector assembly shown in FIG. 1 according to one embodiment.

FIG. 3 is a cut away view of the connector assembly 100 according to one embodiment. One of the exterior side walls 114 (shown in FIG. 1) of the connector assembly 100 is removed in the view shown in FIG. 3. The connector assembly 100 has a mating connector 300 loaded into each of the ports 106. Each latch 120 is biased toward the seal element 206 when the mating connector 300 is loaded into the corresponding port 106. The latches 120 may be partially biased into the interior chamber 202 such that the latches 120 compress the seal element 206. As shown in FIG. 3, the seal element 206 is partially deformed by the latches 120. When compressed by the latches 120, the seal element 206 may contact each of the transverse walls 208, 210, the mating interface wall 212, the latch 120 of the transverse wall 208, and the latch 120 of the transverse wall 210. In one embodiment, the seal element 206 engages each of the transverse walls 208, 210 and the mating interface wall 212 when the seal element 206 is not compressed by the latches 120 and engages the transverse walls 208, 210, the mating interface wall 212, and the latches 120 when the seal element 206 is compressed.

One or more of the upper, lower and forward interfaces 224, 226, 228 may be increased when the seal element 206 is compressed. For example, the surface areas of the seal element 206 and the forward interface 228 that contact one another may be increased when the seal element 206 is compressed relative to the contact between the surface areas when the seal element 206 is uncompressed. The contacting surface areas of the seal element 206 and the upper interface 224 may be increased when the seal element 206 is compressed relative to the contact between the surface areas when the seal element 206 is uncompressed. Similarly, the contacting surface areas of the seal element 206 and the lower interface 226 may be increased when the seal element 206 is compressed relative to the contact between the surface areas when the seal element 206 is uncompressed. With respect to the upper and lower interfaces 224, 226, the surface areas of the seal element 206 and the upper and lower transverse walls 208, 210 that engage one another may be increased when the seal element 206 is compressed due in part to the engagement between the latches 120 and the seal element 206. The contact between the latches 120 and the seal element 206 increases the surface area-to-surface area engagement between the seal element 206 and each of the upper and lower transverse walls 208, 210.

The contact between the seal element 206 and each of the transverse walls 208, 210 and the latches 120 provides an electromagnetic seal in the interior chamber 202. For example, the engagement between the seal element 206 and the transverse walls 208, 210 and the latches 120 may provide a seal that prevents electromagnetic interference in the chamber 202 from radiating through the mating interface 118 (shown in FIG. 1) of the connector assembly 100. Increasing one or more of the upper, lower and forward interfaces 224, 226, 228 between the seal element 206 and each of the upper and lower transverse walls 208, 210 and the mating interface wall 212 may provide an improved electromagnetic seal. For example, the seal element 206 may permit less electromagnetic interference from radiating from the center plate 116 when the seal element 206 is compressed when compared to an uncompressed seal element 206. The electromagnetic interference in the chamber 202 is discharged to a ground reference by the electrically conductive path established by the seal element 206, the center plate 116, and the side walls 112, 114 (shown in FIG. 1).

In one embodiment, the seal element 206 may elastically deform when compressed by one or more of the latches 120 such that the seal element 206 resists being compressed by the latches 120. For example, the seal element 206 may apply a resistive force 302 on the latches 120 in a direction that opposes a deflection direction 304 of the latches 120. The deflection direction 304 represents the direction in which the latches 120 are biased when a mating connector 300 is loaded into the port 106. The resistive force 302 may push the latches 120 toward the mating connectors 300 to assist in engaging the latches 120 and mating connectors 300 with one another.

Figure 4:
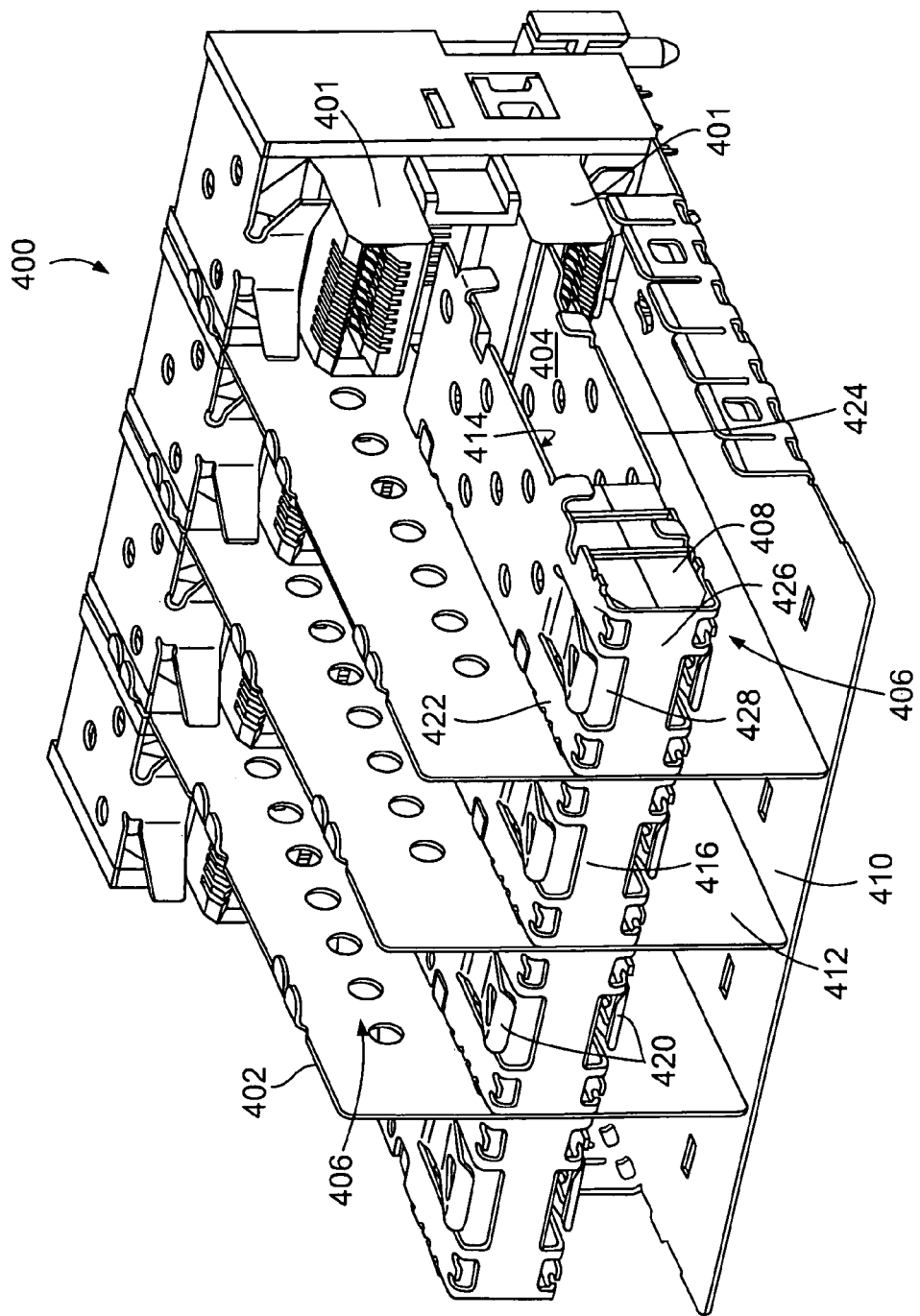
FIG. 4 is a cut away view of a connector assembly according to another embodiment.

FIG. 4 is a cut away view of a connector assembly 400 according to another embodiment. The connector assembly 400 is similar to the connector assembly 100 shown in FIG. 1. For example, the connector assembly 400 includes a shielding connector cage 402 that is shaped to receive a plurality of mating connectors 300 (shown in FIG. 3) and that is similar to the shielding connector cage 102 (shown in FIG. 1). Similar to the connector cage 102, the connector cage 402 includes a top wall (not shown), a bottom wall 410, interior side walls 412, exterior side walls (not shown) and a rear wall (not shown). The connector cage 402 includes center plates 416 that are similar to the center plates 116 (shown in FIG. 1). The center plates 416 include transverse walls 422, 424 that are interconnected by a mating interface wall 426, similar to the transverse walls 208, 210 (shown in FIG. 2) and the mating interface wall 212 (shown in FIG. 2) of the center plates 116. The center plates 416 define interior chambers 404 that are similar to the interior chambers 202 (shown in FIG. 2). The center plates 416 and the top wall, bottom wall 410, exterior side walls, interior side walls 412 and rear walls define a plurality of ports 406 that receive the mating connectors 300. The center plates 416 include latches 420 that are similar to the latches 120 (shown in FIG. 1). The latches 420 engage the mating connectors 300 loaded into the ports 106 to retain the mating connectors 300 in the ports 106. The mating connectors 300 couple with connectors 401 that are housed in the ports 406.

The connector assembly 400 includes formed seal elements 408 disposed within the interior chambers 404 of the center plates 416. In contrast to the seal element 206 (shown in FIG. 2), the formed seal elements 408 are shaped to match the inside surface 414 of the center plate 416. The inside surface 414 extends around and defines at least a portion of the interior chamber 404. The formed seal elements 408 are molded or formed to correspond to the shape of the interior chamber 404 proximate to the mating interface wall 426 such that the seal elements 408 nest within the interior chamber 404. The formed seal elements 408 may have a shape that is complementary to the inside surface 414 of the center plate 416. For example, the formed seal elements 408 may fit inside the interior chamber 404 so that substantially no gaps are provided between the formed seal elements 408 and the inside surfaces 414. Similar to the seal elements 206, the formed seal elements 408 may include or be formed from a conductive elastomeric material.

The formed seal elements 408 include cut outs 428 that align with the latches 420 in the center plate 416. The cut outs 428 may include portions of the formed seal elements 408 that are removed to provide clearance for the latches 420. For example, the cut outs 428 may be provided to permit the latches 420 to be biased toward the interior chamber 404 when the mating connectors 300 (shown in FIG. 1) are loaded into the ports 406 without engaging the formed seal elements 408. Alternatively, the formed seal elements 408 do not include the cut outs 428 such that the seal elements 408 engage the latches 420 when the latches 420 are biased by the mating connectors 300. For example, the formed seal elements 408 may apply a resistive force similar to the resistive force 302 (shown in FIG. 3) on the latches 420 to assist in engaging the latches 420 with the mating connectors 300.

Figure 5:
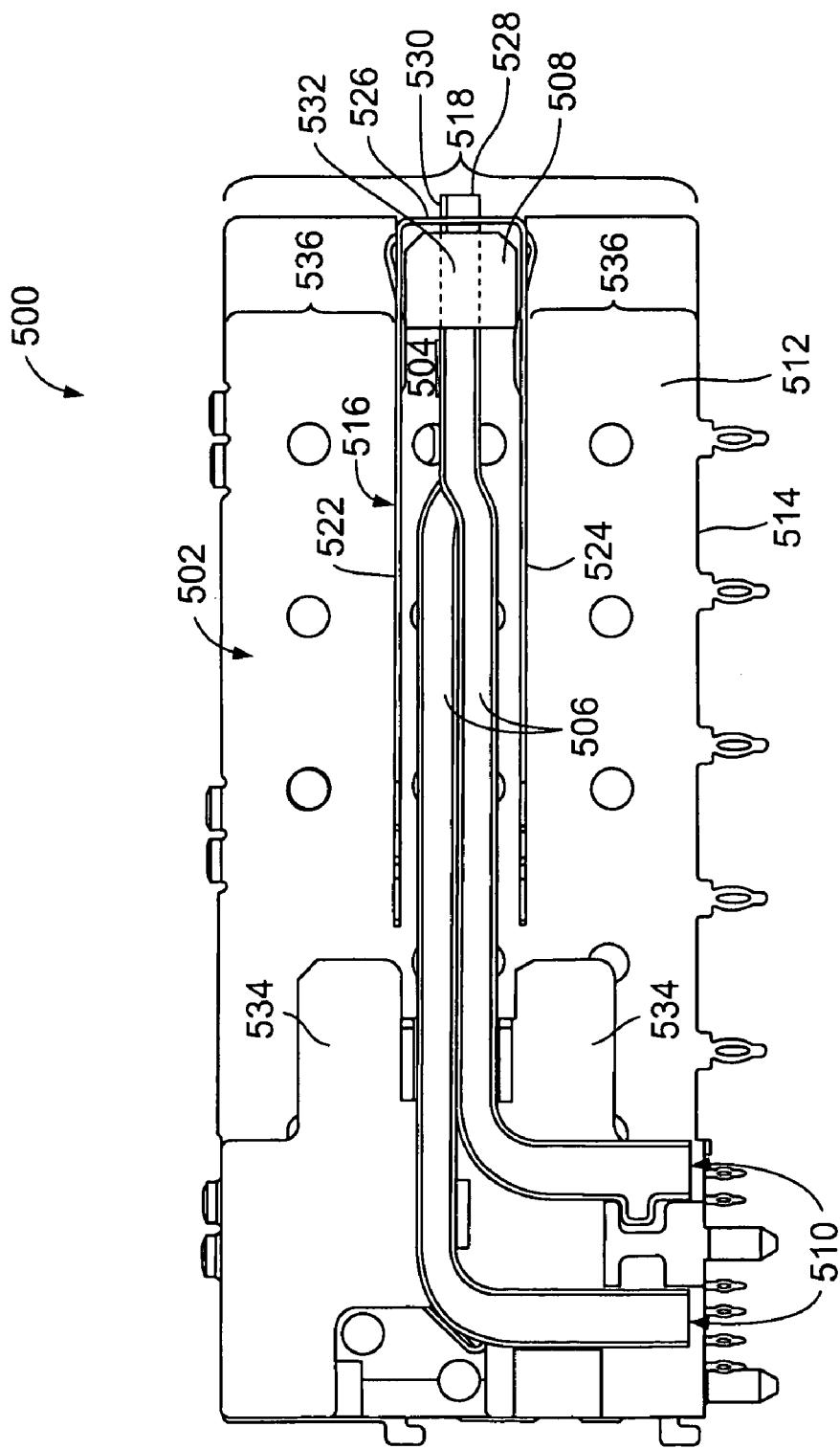
FIG. 5 is a partial cut away view of a connector assembly according to another embodiment.

FIG. 5 is a partial cut away view of a connector assembly 500 according to another embodiment. The connector assembly 500 is similar to the connector assembly 400 (shown in FIG. 4). For example, the connector assembly 500 includes a shielding connector cage 502 that is shaped to receive a plurality of mating connectors 300 (shown in FIG. 3) and that is similar to the shielding connector cage 402 (shown in FIG. 4). The mating connectors 300 are received through a mating interface 518 that is similar to the mating interface 118 (shown in FIG. 1). Similar to the connector cage 402, the connector cage 502 includes a top wall (not shown), a bottom wall 514, interior side walls 512, exterior side walls (not shown) and a rear wall (not shown). The connector cage 502 includes center plates 516 that are similar to the center plates 416 (shown in FIG. 4). The center plates 516 include transverse walls 522, 524 that are interconnected by a mating interface wall 526, similar to the transverse walls 422, 424 (shown in FIG. 4) and the mating interface wall 426 (shown in FIG. 4) of the center plates 416. The mating interface wall 526 includes one or more apertures 530 that are shaped and positioned to receive light pipes 506 that extend through the center plates 516, as described below.

The center plates 516 define interior chambers 504 that are similar to the interior chambers 404 (shown in FIG. 4). The center plates 516 and the top wall, bottom wall 514, exterior side walls, interior side walls 512 and rear walls define a plurality of ports 536 that receive the mating connectors 300. In the illustrated embodiment, the mating interface wall 526 of the center plate 516 includes one or more apertures 530 that extend through the mating interface wall 526. The connector assembly 500 includes light pipes 506 disposed in interior chamber 504. The light pipes 506 may pass through the interior chamber 504 from a location that is proximate to a light source end 510 of the light pipes 506 and through the apertures 530 in the center plates 516 to a location that is proximate to the mating interface 518. The light source end 510 is the end of the light pipes 506 that receives light emanating from a light source (not shown), such as a light emitting diode ("LED"). The light passes through the light pipes 506 and is emitted from the light pipes 506 at a light emitting end 528 of the light pipes 506.

The connector assembly 500 includes formed seal elements 508 disposed within the interior chambers 504 of the center plates 516. The formed seal elements 508 are similar to the seal elements 408 (shown in FIG. 4). For example, the formed seal elements 508 may have a shape that complements the shape of the interior chamber 504 such that the seal elements 508 nest within the interior chamber 504. Also similar to the seal elements 408, the formed seal elements 508 may include or be formed from a conductive elastomeric material. Alternatively, the seal elements 508 may have a different shape than the shape shown in FIG. 5. For example, the seal elements 508 may be shaped similar to the seal element 206 (shown in FIG. 2). The seal elements 508 may include one or more openings 532 that extend through the seal elements 508. The openings 532 may be axially aligned with the apertures 530 in the center plates 516. For example, the openings 532 and the apertures 530 may be aligned with one another to permit the light pipes 506 to extend through both the seal element 508 and the mating interface wall 526. The light emitting ends 528 of the light pipes 506 may thus be visible to an operator of the connector assembly 500 in a position proximate to the mating interface 518 of the connector assembly 500. The light pipes 506 may indicate which of the ports 536 have a mating connector 300 (shown in FIG. 3) loaded therein. For example, each light pipe 506 may correspond with one of the ports 536. When a mating connector 300 is loaded into a port 536 to mate with a connector 534 housed within the port 536, the corresponding light pipe 506 may emit a light from the light emitting end 528.

In order to reduce the leakage of electromagnetic interference through the opening 532 in the seal element 508 and the aperture 530 in the center plate 516, the opening 532 may tightly fit about the light pipe 506. For example, the size of the opening 532 may be slightly smaller than the cross-sectional size of the light pipe 506 to eliminate gaps between the opening 532 and the light pipe 506. Eliminating or reducing the gaps between the opening 532 and the light pipe 506 may reduce the amount of electromagnetic interference emanating through the opening 532 and aperture 530.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
   a shielding cage comprising side walls with ports disposed between the side walls, the ports being configured to receive a mating connector through a mating interface of the shielding cage;
   a center plate comprising transverse walls disposed between and coupling the side walls of the shielding cage to one another, the center plate separating the ports and defining a chamber between the transverse walls and the side walls of the shielding cage;
   an electromagnetic seal element disposed in the chamber of the center plate, the electromagnetic seal element engaging the transverse walls of the center plate to prevent electromagnetic interference within the center plate from radiating through the mating interface; and
   wherein the electromagnetic seal element is compressed between the transverse walls when the mating connector is loaded into at least one of the ports.

2. The connector assembly of claim 1, wherein the electromagnetic seal element is an elastomeric conductive element.

3. The connector assembly of claim 1, wherein the center plate comprises an aperture configured to permit light emitted by a light pipe disposed in the chamber to emanate from the center plate, the electromagnetic seal element comprising an opening aligned with the aperture to permit at least one of the light and the light pipe to pass through the electromagnetic seal element.

4. The connector assembly of claim 1, wherein the center plate comprises a latch projecting into the port, the latch depressed toward the electromagnetic seal element when the mating connector is loaded into the port to compress the electromagnetic seal element within the chamber.

5. The connector assembly of claim 1, wherein the electromagnetic seal element seals the chamber to prevent the electromagnetic interference from radiating from the center plate.

6. The connector assembly of claim 1, wherein the center plate comprises a mating interface wall interconnecting the transverse walls in a location proximate to the mating interface of the shielding cage.

7. The connector assembly of claim 6, wherein the electromagnetic seal element engages the transverse walls and the mating interface wall to prevent the electromagnetic interference from radiating from the center plate.

8. The connector assembly of claim 6, wherein the mating interface wall and the transverse walls are integrally formed as a unitary body.

9. The connector assembly of claim 1, wherein the electromagnetic seal element extends in the chamber from one side wall to the other side wall.

10. A center plate configured to retain mating connectors loaded into ports in a shielding cage through a mating interface of the shielding cage, the shielding cage comprising side walls of the ports, the center plate comprising:
    transverse walls disposed between and coupling the side walls of the shielding cage to one another to separate the ports from one another and define a chamber between the transverse walls and the side walls of the shielding cage;
    a mating interface wall interconnecting the transverse walls and disposed proximate to the mating interface of the shielding cage;
    an electromagnetic seal element disposed in the chamber and engaging the transverse walls to prevent electromagnetic interference from radiating through the mating interface; and
    wherein the electromagnetic seal element is compressed between the transverse walls when the mating connector is loaded into at least one of the ports.

11. The center plate of claim 10, wherein the electromagnetic seal element is an elastomeric conductive element.

12. The center plate of claim 10, wherein the mating interface wall comprises an aperture configured to permit light emitted by a light pipe to emanate froth the mating interface wall, the electromagnetic seal element comprising an opening aligned with the aperture to permit at least one of the light and the light pipe to pass through the electromagnetic seal element.

13. The center plate of claim 10, wherein the transverse walls comprise a latch projecting into the port of the shielding cage, the latch depressed toward the electromagnetic seal element when the mating connector is loaded into the port to compress the electromagnetic seal element within the chamber.

14. The center plate of claim 13, wherein the transverse walls comprise an opening through which the latch is depressed, the electromagnetic seal element electrically interconnecting the transverse walls to prevent the electromagnetic interference from radiating through the opening.

15. The center plate of claim 10, wherein the electromagnetic seal element seals the chamber to prevent the electromagnetic interference from radiating from the center plate at the mating interface.

16. The center plate of claim 10, wherein the mating interface wall is disposed parallel to the mating interface and transverse to the transverse walls.

17. The center plate of claim 10, wherein the mating interface wall and the transverse walls are integrally formed as a unitary body.

18. The center plate of claim 10, wherein the electromagnetic seal element extends in the chamber from one side wall to the other side wall.

* * * * *